United States Patent [19]

Tarneja et al.

[11] 3,888,701

[45] June 10, 1975

[54] TAILORING REVERSE RECOVERY TIME AND FORWARD VOLTAGE DROP CHARACTERISTICS OF A DIODE BY IRRADIATION AND ANNEALING

[75] Inventors: Krishan S. Tarneja; John Bartko, both of Pittsburgh, Pa.

[73] Assignee: Westinghouse Electric Corporation, Pittsburgh, Pa.

[22] Filed: Mar. 9, 1973

[21] Appl. No.: 339,669

[52] U.S. Cl. .................................... 148/1.5; 357/91

[51] Int. Cl. ............................................... H01l 7/54

[58] Field of Search .............. 148/1.5; 317/234, 235

[56] References Cited

UNITED STATES PATENTS

| | | | |
|---|---|---|---|
| 2,911,533 | 11/1959 | Damask | 148/1.5 X |
| 3,272,661 | 9/1966 | Tomono et al. | 148/1.5 |
| 3,532,910 | 10/1970 | Lee et al. | 317/234 |
| 3,533,857 | 10/1970 | Mayer et al. | 148/1.5 |
| 3,736,192 | 5/1973 | Tokuyama et al. | 148/1.5 |

OTHER PUBLICATIONS

Clark et al., *Phil. Mag.*, Nov. 1969, "Isochronal Annealing of p- and n-type Silicon Irradiated at 80°K" Vol. 20, No. 167, pp. 951 to 958.

*Primary Examiner*—L. Dewayne Rutledge
*Assistant Examiner*—J. M. Davis
*Attorney, Agent, or Firm*—C. L. Menzemer

[57] ABSTRACT

The reverse recovery time and forward voltage drop characteristics of a diode are tailored to desired values by irradiating the diode to increase the forward voltage drop above a desired value and to decrease the reverse recovery time below a desired value and thereafter annealing, preferably above about 300°C, the diode to decrease the forward voltage drop and increase the reverse recovery time to desired values. The irradiation step is preferably performed with electron radiation in the energy range between 1 Mev and 3 Mev. More preferred, the electron irradiation is applied to dosage between about $5 \times 10^{13}$ and $1 \times 10^{15}$ electrons/cm$^2$ and most desirably between about $5 \times 10^{13}$ and $5 \times 10^{14}$ electrons/cm$^2$. The irradiation and annealing steps may be repeated two or more times to provide the device with the final desired values for the reverse recovery time and forward voltage drop.

6 Claims, 3 Drawing Figures

TAILORING REVERSE RECOVERY TIME AND FORWARD VOLTAGE DROP CHARACTERISTICS OF A DIODE BY IRRADIATION AND ANNEALING

FIELD OF THE INVENTION

The present invention relates to the making of semiconductor devices and particularly diodes.

BACKGROUND OF THE INVENTION

A semiconductor diode is a two-electrode semiconductor device, having an anode and a cathode, which has marked unidirectional electrical characteristics. A junction diode is a semiconductor diode whose asymmetrical voltage-ampere characteristics are manifested as a result of a PN junction formed at the transition between N-type and P-type regions within the semiconductor wafer. This junction may be either diffused, grown or alloyed.

A high power diode generally requires one of the regions, usually the anode region, have a low impurity concentration, e.g. $1 \times 10^{14}$ to $1 \times 10^{16}$ atoms per $cm^3$. This enables the device to withstand a high reverse blocking voltage without breakdown or punch-through by permitting a wide space charge region. The difficulty with such devices has been the long reverse recovery time upon breakdown into the conduction mode. That is, the time needed for the device to reestablish the blocking mode upon breakdown or punch-through. Such recovery time is primarily dependent upon the recombination time of the minority carriers in the highly resistive region, which as previously stated is usually the anode.

In the past, the recovery time of both high and low power diodes has been reduced by diffusion of gold into the highly resistive region and, in some cases, throughout the semiconductor wafer. However, gold is notorious for its uncontrollability on diffusion. It is therefore difficult to localize the gold diffusion with any precision and/or to provide a uniform gold diffusion within the diffused regions of the body. Gold diffusion has therefore resulted in low quantitative yields, particularly in high power junction diodes. In addition, gold diffusion has been found to increase the leakage current through the PN junction of the device.

It has been described to irradiate semiconductor devices for various reasons. See e.g. patent applications Ser. No. 324,718, filed Jan. 18, 1973, Ser. No. 283,684, filed Aug. 25, 1972, Ser. No. 283,685, filed Aug. 25, 1972, Ser. No. 285,165, filed Aug. 31, 1972, Ser. No. 343,070, filed Mar. 20, 1973, Ser. No. 354,620, filed Apr. 25, 1973 and Ser. No. 337,967, filed Mar. 5, 1973, all of which are assigned to the same assignee as the present invention.

More particularly, it has been described in patent applications Ser. No. 339,242, filed Mar. 8, 1973, and assigned to the same assignee as the present invention, to irradiate diodes and particularly high powered diodes to reduce the reverse recovery time without correspondingly changing other electrical characteristics and particularly the forward voltage drop of the device. However, it has been found that this previous disclosure has its limitations. If a very low reverse recovery time is desired, a higher forward voltage drop must be tolerated. Thus, simply irradiating the diode to reduce the reverse recovery time involves a trade-off to a greater or lesser degree with forward voltage drop.

The present invention eliminates the need for such trade-off. It provides high powered diodes with low reverse recovery times and forward voltage drops heretofore unattainable in normal commercial manufacturing.

SUMMARY OF THE INVENTION

The present invention provides a junction diode semiconductor body in which the reverse recovery time is substantially decreased while the forward voltage drop can be maintained or reduced. It was anticipated prior to the present work that defects created in a semiconductor crystal by particle bombardment and particularly electron irradiations would anneal back to the initial parameters in such a manner that the $V_F$–$t_{rr}$ relationship would follow the irradiation $V_F$–$t_{rr}$ relationship during the course of the anneal. That is, it would follow the same curve. It was only expected that the rates would differ according to the temperature of the anneal. Surprisingly however, it was found by the present work that the device parameters did not follow the irradiation $V_F$–$t_{rr}$ relationship on annealing, but rather $V_F$ reduces at a much faster rate with relation to $t_{rr}$.

The method of the present invention is provided by positioning the junction diode semiconductor body with one major surface thereof and most preferably the major surface adjoining the cathode region of the device for exposure to a radiation source, and thereafter irradiating the device with the radiation source. The irradiation increases the forward voltage drop above a desired value and decreases the reverse recovery time below a desired value. The irradiated diode is subsequently annealed to decrease the forward voltage drop and increase the reverse recovery time to desired values.

The desired values for the forward voltage drop and the reverse recovery time are controlled primarily by the extent of irradiation and the annealing temperature. It may, however, be necessary to repeat the irradiation and anneal to attain the values for the reverse recovery time and the forward voltage drop desired in the final junction diode.

Electron radiation is preferably used as a suitable radiation source in the irradiation step because of availability and inexpensiveness. However, it is contemplated that any kind of radiation such as proton, neutron, alpha and gamma radiation may be appropriate, provided it is capable of disrupting the atomic lattice to create energy levels that substantially increase the recombination rate of the minority carriers.

Further, it is preferred that the radiation level of electron radiation be between about 1 and 3 Mev in energy. Lower energies than this range will result in substantial ionizing collisions and an insufficient or no atomic displacements in the lattice. Thus, for reasonable radiation times negligible decreases in recovery times will be achieved. Conversely, higher energy radiation may cause too severe lattice damage to the semiconductor crystal to maintain other electrical characteristics of the device within nominal values.

It has been found that an electron dosage between about $5 \times 10^{13}$ and $1 \times 10^{15}$ electrons/$cm^2$ are suitable radiation dosages. Lower dosage levels have not been found to insure increase of the forward voltage drop and decrease of the reverse recovery time beyond desired values. Conversely, radiation dosages above $1 \times 10^{15}$ electrons/$cm^2$ are believed to impart too severe lattice damage to the semiconductor crystal to maintain other electrical characteristics in the device.

The annealing is preferably done in an inert atmosphere but can also be accomplished in an air environment at a temperature ranging between about 250° and 350°C. The time and temperature are inversely related as well as controlling of the desired values for forward voltage drop and reverse recovery time. Preferably the annealing is continued for between about 3 and 120 hours at a temperature between about 250° and 350°C.

Other details, objects and advantages of the invention will become apparent as the following description of the present preferred embodiments and present preferred methods of practicing the same proceeds.

BRIEF DESCRIPTION OF THE DRAWINGS

In the accompanying drawings, the present preferred embodiments of the invention and present preferred methods of practicing the invention are illustrated in which.

DESCRIPTION OF THE PREFERRED EMBODIMENTS

Figure 1:
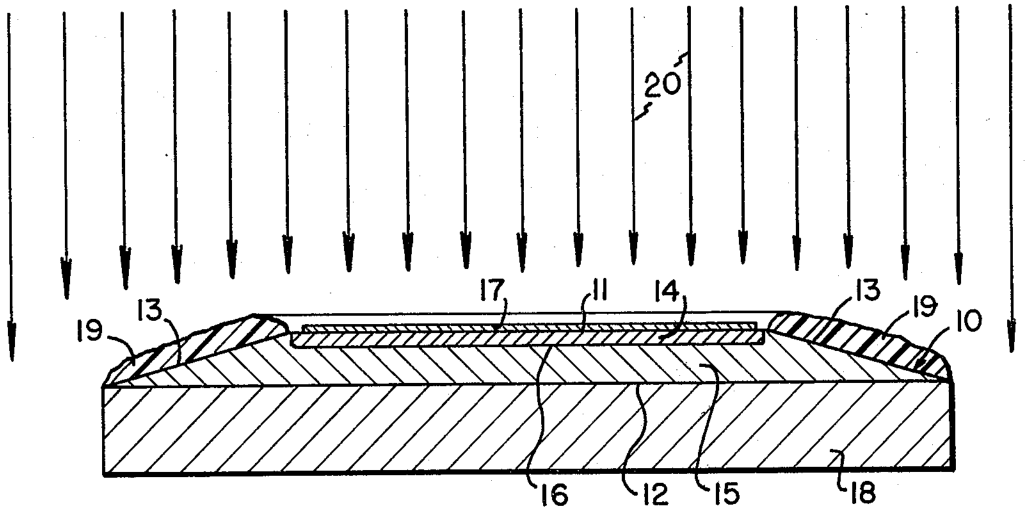
FIG. 1 is an elevational view in cross-section of a high power junction silicon diode being irradiated in accordance with the invention.

Referring to FIG. 1, a junction silicon diode wafer or body 10 is shown having opposed major surfaces 11 and 12, and curvilinear side surfaces 13. Diode body 10 has cathode region 14 and anode region 15 of impurities of opposite conductivity type adjoining major surfaces 11 and 12, respectively. Formed at the transition between regions 14 and 15 in the interior of body 10 is PN junction 16.

To provide electrical connections to the diode body, metal contacts 16 and 18 make ohmic contact to cathode region 14 and anode region 15 at major surfaces 11 and 12, respectively. To reduce channeling effect and atmospheric effects on the diode operation, side surfaces 13 are beveled by lap or spin etching and are coated with a suitable passivating resin 19 such as a silicone, epoxy or varnish composition.

Irradiation is performed on diode body 10 by positioning major surface 11 for exposure to a suitable radiation source. The diode body is thereafter irradiated by radiation 20 from the radiation source to a dosage level sufficient to increase forward voltage drop above a desired value and to decrease reverse recovery time below a desired value. This can be done with 2 Mev electron radiation by irradiating to a dosage level between about $1 \times 10^{14}$ and $1 \times 10^{15}$ electrons/cm$^2$ and most desirably between about $1 \times 10^{14}$ and $5 \times 10^{14}$ electrons/cm$^2$. The electron radiation can be applied as described in FIG. 2 of application Ser. No. 339,242, filed Mar. 8, 1973, (previously mentioned) and the attendent description thereto.

As stated before, electron radiation is preferred for use as the radiation source because of availability and inexpensiveness. Moreover, electron radiation (or gamma radiation) may be preferred in some applications where the damage desired in the semiconductor lattice is to single atoms and small groups of atoms. This is in contrast to neutron, proton and alpha radiation which produce large disordered regions of as many as a few hundred atoms in the semiconductor crystal. The latter type of radiation may, however, be preferred for the radiation source in certain applications because of its better defined range and better controlled depth of lattice damage.

Electron radiation is also preferred over gamma radiation because of its availability to provide adequate dosages in short periods of time. For example, a $1 \times 10^{12}$ electrons/cm$^2$ dosage of 2 Mev electron radiation will result in approximately the same lattice damage as that produced by a $1 \times 10^6$ rads dosage of gamma radiation; and a $1 \times 10^{14}$ electrons/cm$^2$ dosage of 2 Mev electron radiation will result in approximately the same lattice damage as that produced by a $1 \times 10^8$ rads dosage of gamma radiation. Such dosages of gamma radiation, however, require several weeks to be applied, while such dosages of electron radiation can be applied in minutes.

In any case, the irradiation is carried to a dosage sufficient to reduce the reverse recovery time and to increase the forward voltage drop beyond desired values. The precise radiation dosage to achieve these characteristics is dependent on the particular semiconductor material composing the diode body, and the particular type of irradiation and intensity thereof which are used. As previously explained, preferably electron radiation with an intensity between about 1 and 3 Mev is applied to a dosage level between about $5 \times 10^{13}$ and $1 \times 10^{15}$ electrons/cm$^2$ and most desirably between $5 \times 10^{13}$ and $5 \times 10^{14}$ electrons/cm$^2$.

After irradiation of the junction diode body, the device is annealed to decrease the forward voltage drop and increase the reverse recovery time to desired values. The anneal may be done by simply placing the device in an inert atmosphere in a standard induction furnace or the like and heating at a suitable temperature for a suitable time. The anneal can also be carried out in an air environment but the inert atmosphere is preferred because it will retard high temperature effects on the passivation layer. It should be noted in this connection that the time and temperature of the anneal are inversely related. Further, it has been found that the anneal must be performed at a temperature above about 250°C. to achieve the electrical characteristics prescribed for the invention where the irradiation is electron radiation applied with an energy and at a dosage as previously described herein. Conversely, the temperature should be kept below about 350°C to avoid damage to the crystal structure and dislocation of the impurity regions and, in some cases, even lower to avoid decomposition of passivation coatings on the diodes. Where the irradiation is performed with electron radiation, it is preferred that the anneal be conducted at a temperature between 250° and 350°C for a time between 3 and 120 hours.

Further, it is preferred that during the annealing that the reverse recovery time and the forward voltage drop be monitored. This can be done by periodically removing the diode body from the annealing furnace and measuring the electrical characteristics in accordance with JEDEC Standards.

To illustrate the operation of the invention, commercially available silicon junction diodes similar to that shown in FIG. 1 were irradiated and subsequently annealed. The diodes were N type having a nominal diameter of 0.914 inch and a nominal thickness of 75.0 mils. The diffused cathode region had a diameter of about 0.720 inch and a depth of about 65 microns with a surface impurity concentration of about $5 \times 10^{19}$ atoms/cm$^2$. The diodes were irradiated with 2 Mev electron radiation to a dosage of $2 \times 10^{14}$ electrons/cm$^2$.

Two groups of diodes were irradiated to $2 \times 10^{14}$ electrons/cm$^2$. Measurements were made of the reverse recovery time and the forward voltage drop at various times during the irradiation. The measurements on each group are set forth separately as the circular points and the solid curves in FIGS. 2 and 3. Each plotted point on the curves represents the average measurements made on between 10 and 20 devices.

After irradiation, the first group was annealed in a 300°C oven with measurements of reverse recovery time and forward voltage drop made after 2, 6, 22, 89, 99 and 109 hours of accumulated annealing time. The measurements are set forth in the form of the square points and the dotted curve on FIG. 2. Again, the plotted points are the average measurements of the devices in the first group.

Figure 2:
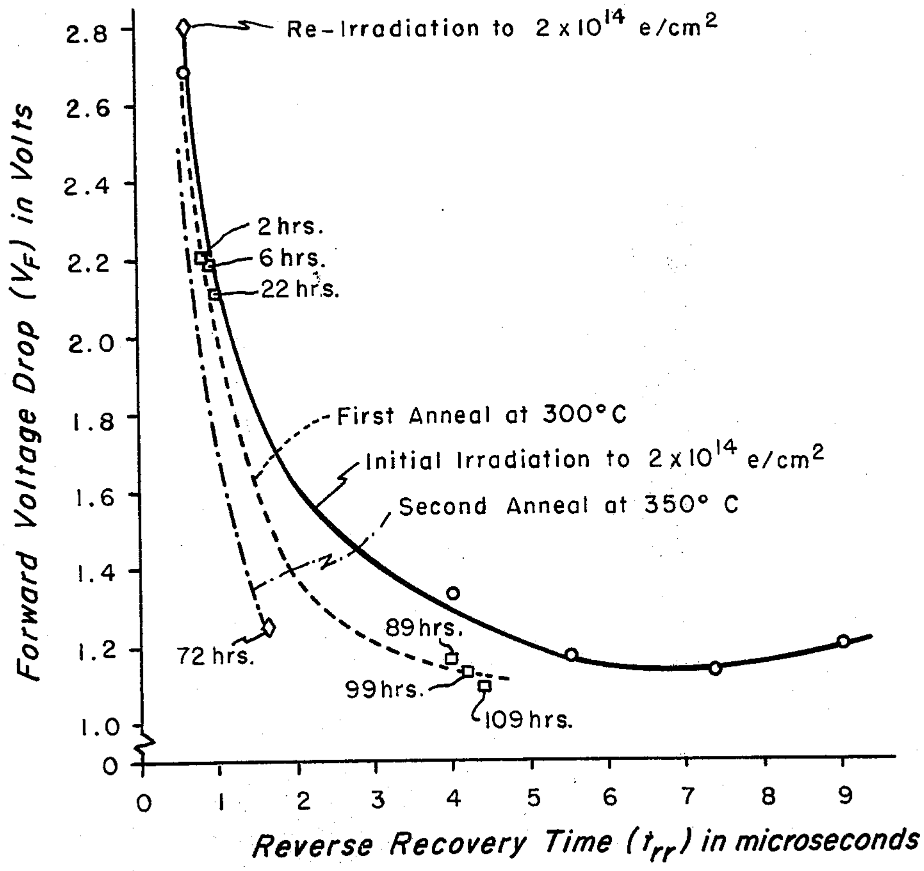
FIG. 2 is a graph plotting the relationship between reverse recovery time and forward voltage drop upon irradiation to $2 \times 10^{14}$ electrons/cm$^2$ with 2 Mev electron radiation and then annealing at 300°C, and subsequent re-irradiation to $2 \times 10^{14}$ electrons/cm$^2$ and then annealing at 350°C.

As shown by FIG. 2, the annealing curve appeared to follow, within the statistical spread, the irradiation curve up to about 22 hours of anneal. The measurements made at 89 hours of annealing showed a marked deviation from the irradiation curve. Further, annealing to 99 and 109 hours continued the trend of the annealing curve away from the irradiation curve. The forward voltage drop after the latter periods of anneal had decreased to below the initial value before irradiation (from 1.12 to 1.1 volts), while the reverse recovery time still remained substantially below the initial value before irradiation (4.4 microseconds compared to 9.0 microseconds).

Several of the diodes in the first group were subsequently re-irradiated to $2 \times 10^{14}$ electrons/cm$^2$ with 2 Mev electron radiation and reannealed at 350°C for 72 hours. The measurements of reverse recovery time and forward voltage drop are plotted as the diamond points and chain line curve on FIG. 2. After 72 hours of annealing at 350°C these devices had an average forward voltage drop of 1.64 volts and an average reverse recovery time of 1.25 microseconds, considerably below the irradiation curve and below the first annealing curve.

Figure 3:
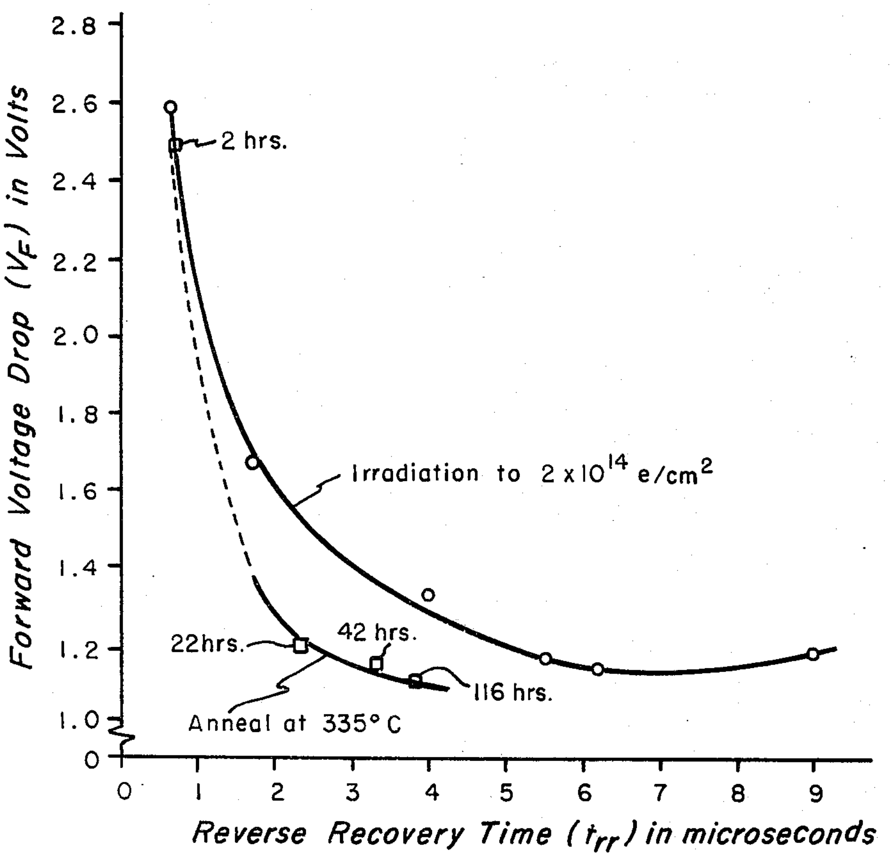
FIG. 3 is a graph plotting the relationship between reverse recovery time and forward voltage drop upon irradiation to $2 \times 10^{14}$ electrons/cm$^2$ with 2 Mev electron radiation and then annealing at 335°C.

The second group of junction diodes which were irradiated to $2 \times 10^{14}$ electrons/cm$^2$ were subsequently annealed in a 335°C oven with measurements of reverse recovery time and forward voltage drop made after 2, 22, 42 and 116 hours of accumulated annealing time. These measurements are plotted as the square points on FIG. 3. Again, the plotted points are the average of the measurements taken off between 15 and 20 devices in the second group. As shown by FIG. 3, after 116 hours, the forward voltage drop (1.10 volts) was less than the original value (1.13 volts) before irradiation and the reverse recovery time is 3.8 microseconds compared to the original 6.3 microseconds.

As shown by the data in FIGS. 2 and 3, the present invention can be used to achieve low reverse recovery times and forward voltage drop values not heretofore obtainable in power diodes. Further, it permits tailoring of the reverse recovery time-forward voltage drop relationship in the diodes over a wide range, and permits this to be done simply and with high quantative yields.

While presently preferred embodiments have been shown and described with particularity, it is distinctly understood that the invention may be otherwise variously performed within the scope of the following claims.

What is claimed is:

1. A method of tailoring reverse recovery time and forward voltage drop characteristics of a diode comprising the steps of:

A. positioning a diode semiconductor body with given first reverse recovery time and first forward voltage drop values with a major surface thereof for exposure to a radiation source;

B. increasing the forward voltage drop to a second forward voltage drop value below a desired value and decreasing the reverse recovery time to a second reverse recovery time value below a desired value by irradiating the positioned diode semiconductor body with the radiation source; and C. decreasing the forward voltage drop to a third desired forward voltage drop value and increasing the reverse recovery time to a third desired reverse recovery time value below said first reverse recovery time value by annealing the irradiated diode semiconductor body.

2. A method of tailoring reverse recovery time and forward voltage drop characteristics of a diode as set forth in claim 1 comprising the additional step of:

D. repeating steps A through C at least once.

3. A method of tailoring reverse recovery time and forward voltage drop characteristics of a diode as set forth in claim 1 wherein:

step B is performed with an electron radiation source.

4. A method of tailoring reverse recovery time and forward voltage drop characteristics of a diode as set forth in claim 1 wherein:

step C is performed at an anneal temperature above about 250°C.

5. A method of tailoring reverse recovery time and forward voltage drop characteristics of a diode comprising the steps of:

A. positioning a diode semiconductor body with a major surface thereof for exposure to an electron radiation source with an intensity between about 1 and 3 Mev;

B. irradiating the positioned diode body with the electron radiation source to a dosage between about $5 \times 10^{13}$ and $1 \times 10^{15}$ electrons/cm$^2$; and C. annealing the irradiated diode body in an insert atmosphere at a temperature above about 250°C until desired values are provided for the reverse recovery time and forward voltage drop characteristics of the device.

6. A method of tailoring reverse recovery time and forward voltage drop characteristics of a diode as set forth in claim 5 wherein:

the irradiation dosage is between $5 \times 10^{13}$ and $5 \times 10^{14}$ electrons/cm$^2$.

* * * * *